United States Patent [19]
Copel et al.

[11] Patent Number: 5,316,615
[45] Date of Patent: May 31, 1994

[54] SURFACTANT-ENHANCED EPITAXY

[75] Inventors: Matthew W. Copel, Katonah; Rudolf M. Tromp, Mount Kisco, both of N.Y.

[73] Assignee: International Business Machines Corporation, Armonk, N.Y.

[21] Appl. No.: 28,644

[22] Filed: Mar. 9, 1993

Related U.S. Application Data

[63] Continuation of Ser. No. 498,236, Mar. 23, 1990, abandoned.

[51] Int. Cl.$^5$ ............................................. C30B 25/18
[52] U.S. Cl. ..................................... 117/95; 117/106; 117/935; 117/936; 117/939
[58] Field of Search ...................... 156/610, 613, 614; 437/106, 111, 126, 131; 148/DIG. 59

[56] References Cited

U.S. PATENT DOCUMENTS

| | | | |
|---|---|---|---|
| 3,394,289 | 7/1968 | Lindmayer | 437/111 |
| 4,255,208 | 3/1981 | Deutscher et al. | 437/131 |
| 4,769,341 | 9/1988 | Luryi | 437/126 |
| 4,843,028 | 6/1989 | Herzog et al. | 437/126 |
| 4,891,329 | 1/1990 | Reisman et al. | 437/131 |
| 4,907,974 | 3/1990 | Gotoh | 437/126 |

FOREIGN PATENT DOCUMENTS

| | | | |
|---|---|---|---|
| 62-98614 | 5/1987 | Japan | 437/131 |
| 6428817 | 1/1989 | Japan | 437/131 |

OTHER PUBLICATIONS

B.-Y. Tsaur et al. *Applied Physics Letters*, vol. 38 pp. 779-781 (May 15, 1981).
T. Narusawa and W. M. Gibson *Physical Review Letters*, vol. 47, pp. 1459-1462 (Nov. 16, 1981).
R. M. Tromp et al. *Nuclear Instruments and Methods in Physics Research*, vol. B4, pp. 155-166 (1984).
M. Asai et al., *Journal of Applied Physics*, vol. 58, pp. 2577-2583 (Oct. 1, 1985).
J. F. van den Veen, *Surface Science Reports*, vol. 5, pp. 199-288, (1985).
R. I. G. Uhrberg et al., *Physical Review Letters*, vol. 56, pp. 520-523 (Feb. 3, 1986).
J. Bevk et al., *Applied Physics Letters*, vol. 49, pp. 286-288 (Aug. 4, 1986).
K. Sakamoto et al., *Japanese Journal of Applied Physics*, vol. 26, pp. 666-670 (May 1987).
M. Zinke-Allmang et al., Journal of Vacuum Science and Technology, vol. A5, pp. 2030-2031 (Jul./Aug. 1987).
R. D. Bringans et al., *Physica Scripta*, vol. T17, pp. 7-12, (1987).
M. Zinke-Allmang et al., *Materials Research Society Symposium Proceedings*, vol. 77, pp. 703-708 (1987).
P. M. J. Maree et al., *Surface Science*, vol. 191, pp. 305-328 (1987).
M. Copel and R. M. Tromp, *Physical Review B*, vol. 37, pp. 2766-2769 (Feb. 15, 1988).
M. Copel et al., *Physical Review B*, vol. 37, pp. 10756-10763 (Jun. 15, 1988).
F. J. Himpsel et al., *Physical Review B*, vol. 38, pp. 6084-6096 (Sep. 15, 1988).

(List continued on next page.)

*Primary Examiner*—Robert Kunemund
*Attorney, Agent, or Firm*—Jeffrey L. Brandt; Daniel P. Morris

[57] ABSTRACT

The present invention broadly concerns layered structures of substantially-crystalline materials and processes for making such structures. More particularly, the invention concerns epitaxial growth of a substantially-crystalline layer of a first material on a substantially-crystalline second material different from the first material.

12 Claims, 3 Drawing Sheets

OTHER PUBLICATIONS

G. J. Fisanick et al., *Materials Research Society Symposium Proceedings*, vol. 102, pp. 25–30 (1988).

H. Jorke, *Surface Science*, vol. 193, pp. 569–578 (1988).

D. A. Steigerwald et al., *Surface Science*, vol. 202, pp. 472–492 (1988).

E. Kasper and H. Jorke, *Chemistry and Physics of Solid Surfaces*, vol. 7, pp. 557–581 (1988).

C.-Y. Park et al., *Japanese Journal of Applied Physics*, vol. 27, pp. 147–148 (1988).

S. S. Iyer et al., *Applied Physics Letters*, vol. 54, pp. 219–221 (Jan. 16, 1989).

M. Copel et al., *Physical Review Letters*, vol. 63, pp. 632–635 (Aug. 7, 1989).

F. K. Le Goues et al., *Physical Review Letters*, vol. 63, pp. 1826–1829 (Oct. 23, 1989).

B. S. Meyerson et al., *Applied Physics Letters*, vol. 53, pp. 2555–2557 (Dec. 19, 1988).

J. C. Tsang et al., *Applied Physics Letters*, vol. 51, pp. 1732–1734 (Nov. 23, 1987).

M. A. Olmstead et al., *Physical Review B*, vol. 34, pp. 6041–6044 (Oct. 15, 1986).

SURFACTANT-ENHANCED EPITAXY

This application is a continuation of application Ser. No. 07/498,236 filed Mar. 23, 1990 now abandoned.

FIELD OF THE INVENTION

The present invention broadly concerns layered structures of substantially-crystalline materials and processes for making such structures. More particularly, the invention concerns epitaxial growth of a substantially-crystalline layer of a first material on a substantially-crystalline second material different from the first material.

BACKGROUND ART

A primary concern in obtaining crystalline film growth by molecular-beam epitaxy (MBE) or other vapor-phase technique is the mode of growth of the film. Three principal modes of such film growth are (1) layer-by-layer growth, referred to as a "Frank-Van der Merwe" growth mode; (2) "islanding," referred to as a "Volmer-Weber" growth mode; and (3) layer-by-layer growth to a theshold thickness, followed by islanding, referred to as a "Stranski-Krastanov" growth mode. In either growth mode which entails "islanding," the film ultimately becomes divided into domains or "islands" of crystallinity. Such a division of a film into islands of crystallinity constitutes a disruption of the long-range crystal structure desired for many applications—particularly for many applications in the field of solid-state electronics.

Surface free energies and lattice-strain energies are significant factors in determining which growth mode will be dominant when a crystallizable material is deposited on a surface of a substrate to form a film. Putting aside the matter of the lattice strain energy of the film, theoretical models of epitaxial growth suggest that the growth mode is largely determined by the surface free energy of the substrate surface ($\delta_s$), the surface free energy of the deposited layer ($\delta_f$), and an interface free energy ($\delta_i$). An inequality expression involving these free energies $\delta_s > \delta_f + \delta_i$ specifies a condition under which a deposited film effectively wets a substrate. When a crystallizable material deposited on a substrate wets the substrate, Frank-Van der Merwe layer-by-layer epitaxial growth may occur. If the inequality has the opposite direction, there is usually no wetting of the substrate when the crystallizable material is deposited on the substrate and, Volmer-Weber immediate islanding growth tends to occur. The Stranski-Krastanov thickness-threshold islanding growth generally tends to occur when the deposited material wets the substrate, but the lattice strain energy of the resulting deposited layer is unfavorable, or when there is an added complication such as interface mixing or surface reconstruction.

It would often be desirable to fabricate an epitaxial layer of one element embedded in a crystalline matrix of another element. In other words, it would often be desirable to fabricate layered structures with a crystalline substrate of a first element, an embedded epitaxial layer of a second element, and a capping epitaxial layer of the first element of the substrate.

In general, for two elements A and B, one of the elements has a lower surface free energy than the other. Consequently, if element A can be grown on element B in either a Frank-Van der Merwe layer-by-layer growth mode or a Stranski-Krastanov thickness-threshold islanding growth mode, then element B will grow on element A in a Volmer-Weber immediate islanding mode. Consequently, there is a significant barrier to the growth of an epitaxial layer of one element embedded in a crystalline matrix of the other element; that is, to the growth of layered structures of the elements in the order A/B/A or B/A/B. If the film to be embedded grows well on the substrate, then the capping layer ordinarily does not grow well on the film to be embedded. Conversely, if the capping layer were to grow well on the film to be embedded, then the film to be embedded would tend not to grow well on the substrate in the first instance.

Germanium has a lower surface free energy than that of silicon and the interface free energy $\delta_i$ may generally be considered insignificant. Germanium growth on silicon above about 400° C. follows a Stranski-Krastanov thickness-threshold islanding growth mode: at coverages below about three monolayers, layer-by-layer epitaxial growth is usually observed. At coverages corresponding to more than about three monolayers of germanium, islanding of the germanium generally occurs.

Attempts have been made to avoid such islanding by inhibiting the mobility of the germanium layer by lowering the growth temperature. However, it is generally found that films grown by low temperature processes tend to suffer from poor crystal quality and frequently from inferior electrical properties as well. Other attempts to avoid islanding of germanium on silicon have involved increasing the rate of deposition of germanium. If the germanium deposition growth rate is sufficiently high, it is possible to grow germanium layers with thicknesses which exceed the thickness normally associated with islanding. However, even using such a high-growth rate technique, it has been found that germanium films can be made only about six monolayers thick before a deterioration of the film properties is observed.

The tendency of germanium films to island after the first few monolayers can be observed experimentally using Rutherford ion backscattering analysis. In FIG. 1, 100 keV He+ Rutherford ion backscattering spectra of germanium deposited on a substrate of silicon (001) by a conventional molecular-beam-epitaxy process are plotted for the initial stages of germanium film growth at about 500° C. After approximately the first three monolayers, the intensity of the leading germanium peak saturates. With further increases in coverage by germanium, the background behind the germanium peak increases, indicating that growth is restricted to islands of $\geq 50$ Å thickness. The tendency of germanium to cluster on silicon has hindered previous attempts to grow epitaxial films of germanium on silicon.

Attempts to grow multilayer silicon-germanium superlattices must overcome the fundamental limitations imposed by the growth modes of the constituents. Studies of Si/Ge/Si quantum-well structures have revealed islanding of silicon capping layers as well as severe interdiffusion effects, both evidently resulting from surface energetics.

SUMMARY OF THE INVENTION

We have invented a surfactant-enhanced epitaxy process which permits essentially epitaxial layers of a first material such as germanium to be embedded in a substantially-crystalline second material such as silicon and which avoids problems of the prior art noted above.

Broadly, the process of the invention involves depositing a layer of a first crystallizable material on a target surface of a substantially-single-crystalline-portion of a second material to produce a multi-atomic-layer, essentially-epitaxial layer of the first material on the second material.

The process of the invention includes the step of exposing the target surface of the second material to a high vacuum. A gaseous flux comprising a multivalent surfactant element is directed onto the target surface to deposit the surfactant element on the target surface. The surfactant element is deposited with a coverage of at least approximately one monolayer.

The process of the invention includes the step of directing a gaseous flux comprising the first material onto the target surface bearing the multivalent surfactant element. The multivalent surfactant element facilitates a layer-by-layer epitaxial growth of the first material on the target surface of the second material.

Arsenic is a particularily preferred multivalent surfactant element for the surfactant-enhanced epitaxy process of the invention. Antimony is a preferred multivalent surfactant element for the process. Group III and group V elements including boron, aluminium, gallium, indium, thallium, phosphorous, and bismuth together with gold, silver and lead are expected to be suitable multivalent surfactant elements for certain applications.

In a preferred embodiment of the process of the invention, a gaseous flux comprising the multivalent surfactant element is directed onto the target surface bearing the surfactant element during a time when the gaseous flux comprising the first material is directed onto the surface. In this way a coverage of the surfactant element on the surface is maintained as the layer of first material is deposited.

A preferred layered structure of the invention includes a substrate comprising substantially-single-crystalline silicon having an oriented crystal face. The preferred layered structure of the invention also includes a layer comprising substantially-single-crystalline germanium extending on the oriented crystal face of the silicon substrate. The crystal lattice of the germanium is essentially epitaxial to the crystal lattice of the silicon substrate. The germanium layer has a thickness of greater than six monolayers. The quality of the crystallinity of the germanium layer is sufficient to provide a minimum yield $\chi_{min}$ of about 5 percent or less for substantially-channeled incidence to essentially-random incidence Rutherford ion backscattering, as measured with an approximately 100 keV beam of He+ ions.

If desired, the preferred germanium-on-silicon layered structure of the invention described in the preceeding paragraph can include an overlayer comprising substantially single-crystalline silicon extending on a surface of the germanium layer opposing the silicon substrate. The crystal lattice of the silicon in the overlayer is preferably essentially epitaxial to the crystal lattice of the germanium layer. The essentially-epitaxial germanium layer is thereby effectively embedded in substantially-crystalline silicon.

A preferred layered structure of the invention may include a plurality of repeating pairs of adjacent layers of substantially single-crystalline silicon and substantially single-crystalline germanium. The crystal lattices of adjacent layers of silicon and germanium are preferably essentially epitaxial to one another to form a silicon/germanium superlattice.

In one preferred layered structure of the invention, a silicon substrate may comprise a first dopant element at a first dopant concentration in a region in the substrate proximate an epitaxial layer of germanium. The layer of germanium may include of second dopant element different from the first dopant element at a second dopant concentration in a region proximate to the silicon substrate In certain preferred layered structures of the invention, the thickness of the germanium layer may exceed six monolayers effectively without islanding or substantial breakdown of epitaxy. Moreover, such a layer of germanium may be encapsulated by a silicon overlayer that is substantially epitaxial, effectively island free, and has essentially not intermixed with the germanium.

Preferred embodiments of the process of the invention can be used, for example, to deposit a layer of germanium on a crystal face of a silicon substrate with an (001) crystalline orientation having a thickness of essentially macroscopic dimensions. For thicknesses of up to about ten or twelve monolayers, the layer of germanium may be essentially defect free. As the thickness of the germanium layer is increased from about ten or twelve monolayers to about fifteen monolayers, defects in the crystal lattice generally begin to appear to compensate for an approximately four-percent mismatch between lattice dimensions of germanium and silicon. For thicknesses of the germanium layer greater than about fifteen monolayers, strain-relief defects combining two Σ9 boundaries and a twin tend to occur in the germanium layer. Such defects are generally small in size, essentially uniformly distributed, and effectively independent of one another. A detailed analysis of the strain-relief defects in such germanium layers produced in accordance with the present invention is set forth in an article published by the present inventors and a co-worker in *Physical Review Letters*, volume 63, pages 1826 through 1829 (Oct. 23, 1989), which article is hereby incorporated in the present specification by reference.

According to one preferred process of the invention, germanium may be epitaxially embedded in silicon by the following procedure: A clean surface of silicon having a (001) crystallographic orientation may be prepared to serve as a substrate surface. The substrate surface may exhibit a (1×2) surface unit cell characteristic of silicon (001). The silicon substrate is preferably heated to a temperature between about 400° C. and about 700° C. The substrate surface is then preferably exposed to a flux of arsenic vapor which mat be evaporated from a heated crucible. Sufficient arsenic is preferably deposited on the sample to result in a saturation coverage of roughly one monolayer. The arsenic evidently bonds to an outermost layer of silicon atoms. Arsenic and germanium are then preferably simultaneously co-deposited on the substrate surface bearing the arsenic. The temperature of the sample is preferably held in a range between about 450° C. and about 550° C. After a desired thickness of germanium is deposited, a silicon capping layer may be deposited on the sample. In certain cases no arsenic flux need be applied when the silicon capping layer is deposited. During the deposition of the capping layer, the sample is preferably maintained at substantially the same temperature as maintained during the co-deposition of germanium and arsenic.

In preferred processes of the invention employing a surface layer of arsenic, the arsenic appears to function as a surface-active agent or surfactant. The presence of the surfactant generally enables the epitaxial growth of germanium on a (001) crystal face of silicon to extend to thicknesses exceeding the three-to-six monolayers known heretofore. The arsenic tends to remain on an outer surface of the germanium layer as the germanium layer grows. The presence of an arsenic surface layer tends to improve significantly the quality of a capping layer of silicon applied over the germanium layer by tending to reduce islanding and interdiffusion.

The chemical mechanism of the process of the present invention is not fully understood at this time. The mechanism set forth below is presently believed to account for the enhanced epitaxial growth observed in preferred embodiments of the invention and is offered for the benefit of the reader. However, the present invention may be practiced and its advantages enjoyed whether or not the mechanism described below is correct in all of its particulars. The mechanism offered below should not be construed as a limitation to the scope of the invention.

Investigations of arsenic adsorption on silicon and germanium surfaces have shown that arsenic adsorbs on the surface essentially without any intermixing with the substrate. Surprisingly, however, it appears that when a growth species of silicon or germanium is deposited on a substrate which bears an approximately monolayer coverage of arsenic in accordance with preferred embodiments of the invention, atoms of arsenic and the deposited growth species of silicon or germanium rapidly exchange sites. The growth species is thus incorporated into sites on the surface of the substrate. Moreover, once the growth species is incorporated onto a site on the surface effectively below the arsenic, surface diffusion of the growth species appears to be significantly reduced. The arsenic layer thus appears to inhibit the formation of islands of the growth species, but allows a film of the growth species to grow epitaxially. Although arsenic atoms and atoms of the growth species rapidly exchange sites upon deposition of the growth species, in preferred embodiments of the process of the invention, arsenic is not incorporated into the resulting epitaxial film at concentrations greater than concentrations normally associated with conventional semiconductor dopant concentrations.

Numerous types of layered structures may be fabricated using a multivalent surfactant element to influence the growth mode of the constituents in accordance with the invention—by tending to alter the growth mode from principally island formation to essentially layer-by-layer epitaxial growth, for example. Among such types of layered structures of the invention are epitaxial germanium embedded in crystalline silicon, $Ge_xSi_{1-x}$ alloy layers embedded in a substantially-crystalline silicon or germanium matrix, pure silicon layers embedded in a germanium host, and capping of a much thicker heterolayer. The structures of the invention can be repeated in multiple iterations to form a superlattice, if desired.

The structure of the invention may also be fabricated with a compound semiconductor as one of the constituents, if desired. For example, germanium could be embedded in a gallium-arsenide matrix.

Preferably, the multivalent surfactant may be introduced by molecular-beam epitaxy. Alternatively, the surfactant can be introduced by a chemical source such as $AsH_3$. A chemical source such as $SiH_4$ or $GeH_4$ can be used to introduce the growth species, if desired.

In a preferred embodiment of the invention, epitaxial germanium may be grown on an (001) crystal face of a substantially-crystalline silicon substrate. Alternatively, it may be advantageous in certain applications to grow epitaxial germanium on a (111) crystal face or crystal faces of other crystallographic orientations in accordance with the invention.

Preferably, when epitaxial germanium is grown according to the invention on an (001) crystal face of a substantially-crystalline silicon substrate, the substrate is maintained at a temperature in the range of from about 450 degrees C. to about 550 degrees C. Preferably, when epitaxial germanium is grown according to the invention on a (111) crystal face of such a silicon substrate, the substrate is maintained at a temperature in the range of from about 550 degrees C. to about 650 degrees C.

Preferred layered structures of the invention can be used to advantage in solid-state electronic devices.

The surfactant-enhanced epitaxy process of the invention may be used to fabricate transistors with bases of $Ce_x Si_{1-x}$ alloy. After growth of such an alloy base, a silicon emitter may be grown by chemical vapor deposition or molecular beam epitaxy. The use of a surfactant element in accordance with the invention during initial emitter growth would be advantageous in tending to insure an abrupt interface in a critical region of the p-n junction.

The process of the invention may be used to fabricate multilayered silicon/germanium superlattices. Such silicon/germanium superlattices may find application as x-ray mirrors.

BRIEF DESCRIPTION OF THE DRAWINGS

Preferred embodiments of the invention are described below with reference to the following drawings. The Rutherford ion backscattering data of the drawings were obtained with a medium-energy ion scattering system employing an approximately 100 keV beam of He+ ions. An electrostatic energy analyzer was used to resolve the backscattered ions. For channeling-incidence data, the ion beam was directed substantially along a (111) crystallographic axis of the sample. Random-incidence data were obtained by an azimuthal rotation of about eleven degrees about the sample normal.

PREFERRED MODE FOR CARRYING OUT THE INVENTION

Figure 2:
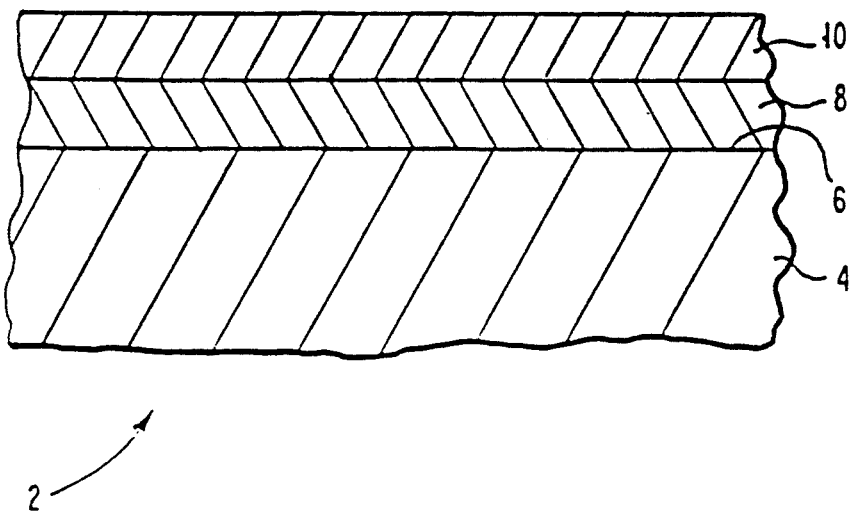
FIG. 2 is a partial cross-sectional diagram of a preferred embedded epitaxial germanium layer in a silicon matrix.

Turning now to FIG. 2, an embedded epitaxial layer structure 2 of the invention includes a substrate 4 of crystalline silicon having an oriented crystal face with an (001) crystallographic orientation. An embedded layer 8 of epitaxial germanium coats the oriented crystal face 6 of the silicon substrate 4. A capping layer 10 of epitaxial silicon coats the embedded layer 8 of germanium.

A preferred embedded epitaxial layer structure 2 of the invention may be made by the following preferred process of the invention.

A substrate of crystalline silicon having a crystal face with an (001) crystalline orientation is introduced into a stainless-steel, ultra-high-vacuum vacuum system. Prior to insertion into the vacuum system the sample is not subjected to any chemical etching or pre-cleaning steps. The vacuum system is evacuated to a base pressure of about $5 \times 10^{-11}$ Torr. The silicon substrate is degassed by heating to about 600° C. for several hours, followed by an anneal at about 900° C. for approximately 30 minutes. Subsequently the crystal face of the silicon substrate is sputtered with an argon ion beam with an energy of about 1 keV and an angle of incidence of about 60 degrees with the surface normal, at a dose dose of about $5 \times 10^{14}$ ions per cm$^2$ Finally, the sample is heated to approximately 1050° C. for about one minute to remove the native oxide. After flash-off of the native oxide, the crystal face exhibits a $(2 \times 1)$ low energy electron diffraction (LEED) pattern, characteristic of an atomically clean Si(001) surface.

Prior to the commencement of growth of the germanium layer, the substrate is heated to a growth temperature of about 500° C. The (001) crystal face of the heated silicon substrate is exposed to a flux of As$_4$ molecules, evaporated from a quartz crucible containing solid elemental arsenic maintained at a temperature of in the range of from roughly 400° to roughly 500° C. After several minutes the crystal face will be covered with close to a monolayer of arsenic. Further exposure to As$_4$ vapor will not increase the coverage, which saturates at approximately one monolayer.

The crystal face of the silicon substrate covered with approximately one monolayer of arsenic is now exposed to a flux of germanium vapor. Germanium is evaporated from a boronnitride crucible containing elemental, liquid germanium maintained at a temperature of about 1000° C. The growth rate was about 0.3 monolayers per minute. During growth of the germanium film, the substrate is simultaneously exposed to a flux of As$_4$, as in the preceeding step. Without a continuous arsenic flux, the surface arsenic coverage slowly drops due to reevaporation of arsenic from the substrate surface. After reaching the desired thickness of deposited germanium, both the germanium and the arsenic fluxes are removed.

In the final step, the substrate bearing the germanium film an a surface monolayer of arsenic is exposed to a flux of silicon vapor. Silicon is evaporated with an electron-beam evaporator. Specifically, an approximately 3 keV focused electron beam is directed onto a central portion of a silicon disk, which melts the silicon. The silicon vapor which emanates from the molten material provides the silicon flux that impinges on the coated substrate. Silicon was grown at a rate in the range of 0.2 to about 0.4 monolayers per minute. The flux of silicon is continued until the thickness of the silicon capping layer reaches a desired value.

During the growth steps the pressure in the sample chamber is in the range from about $1 \times 10^{-10}$ to about $2 \times 10^{-10}$ Torr. The arsenic, germanium and silicon evaporators are located in a separate vacuum chamber, coupled to the sample chamber. The silicon and germanium evaporators are surrounded by water-cooled copper shrouds. The arsenic evaporated is surrounded by a liquid-nitrogen-cooled copper shroud. The evaporators are well shielded from each other, preventing cross-contamination. Sample and cross-contamination. Sample and evaporator chambers are pumped by liquid helium cooled cryopumps.

Figure 1:
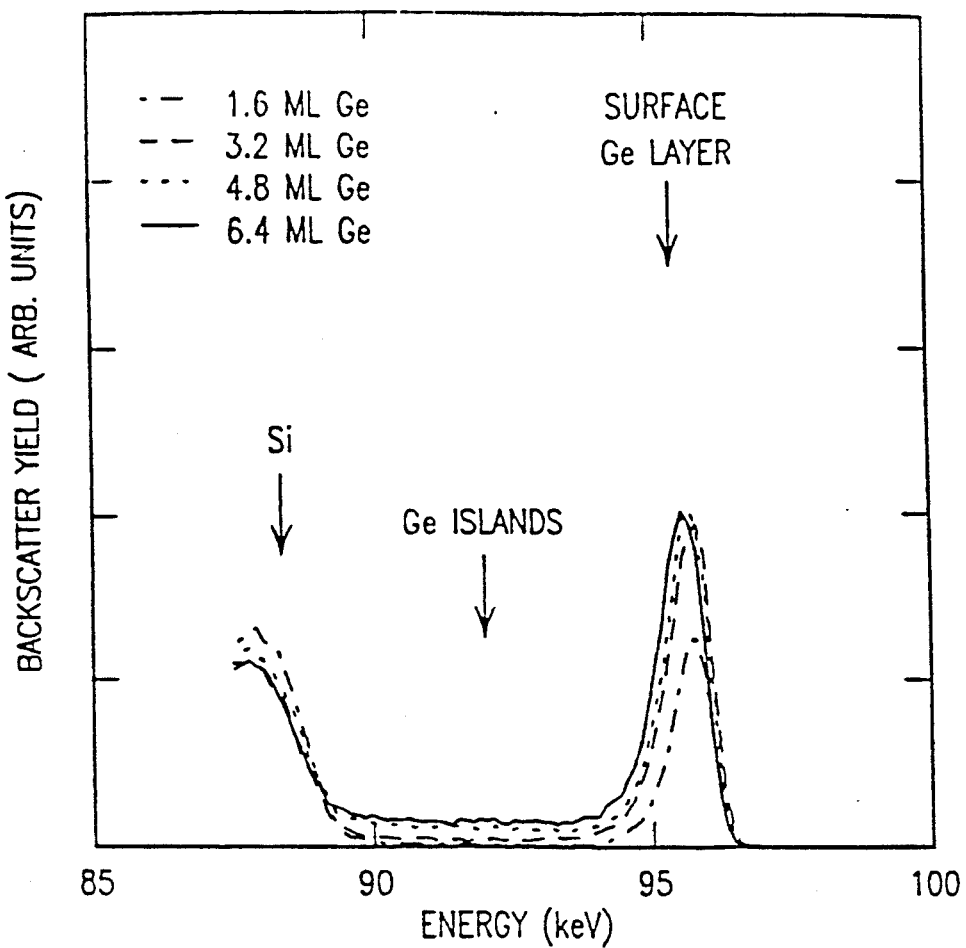
FIG. 1 provides ion backscattering spectra for certain Ge/Si(001) films grown conventionally without an arsenic surfactant layer. All of the spectra were taken in a random, non-channelling incidence direction. A tail on the germanium backscatter peak is attributed to islanding of the germanium. The islanding begins at a coverage of roughly three monolayers. The continuous surface germanium layer saturates at a coverage of about three monolayers.
Figure 3C:
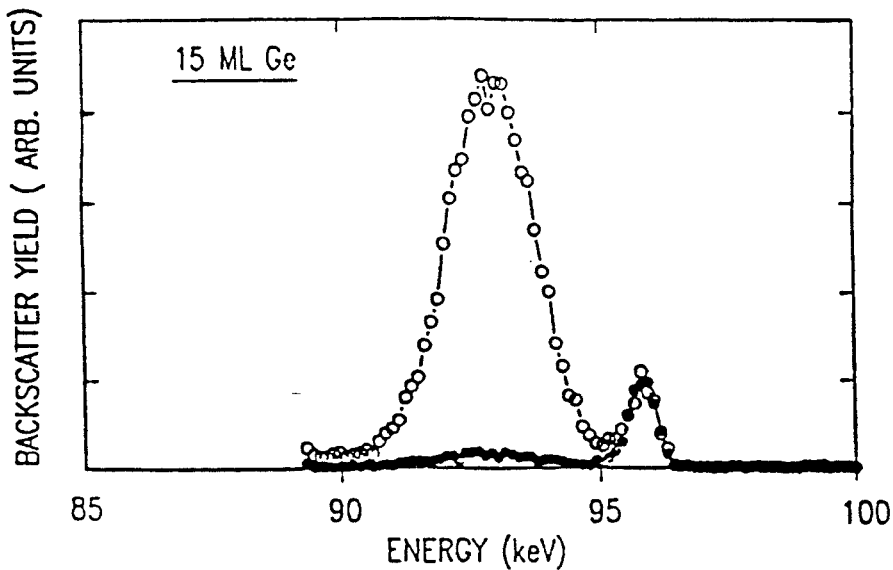
FIGS. 3a-3c provide ion backscattering spectra for preferred Si/Ge/Si(001) epitaxial-germanium-embedded-in-silicon structures of the invention grown with an arsenic surfactant. Spectra are shown in each of FIGS. 3a-3c for both channeled and randomly incident beams. Islanding of the germanium is not observed through a coverage of about fifteen monolayers. The germanium films have been capped with approximately sixteen monolayers of epitaxial silicon. The arsenic layer resides on top of the silicon capping layer.
Figure 3B:
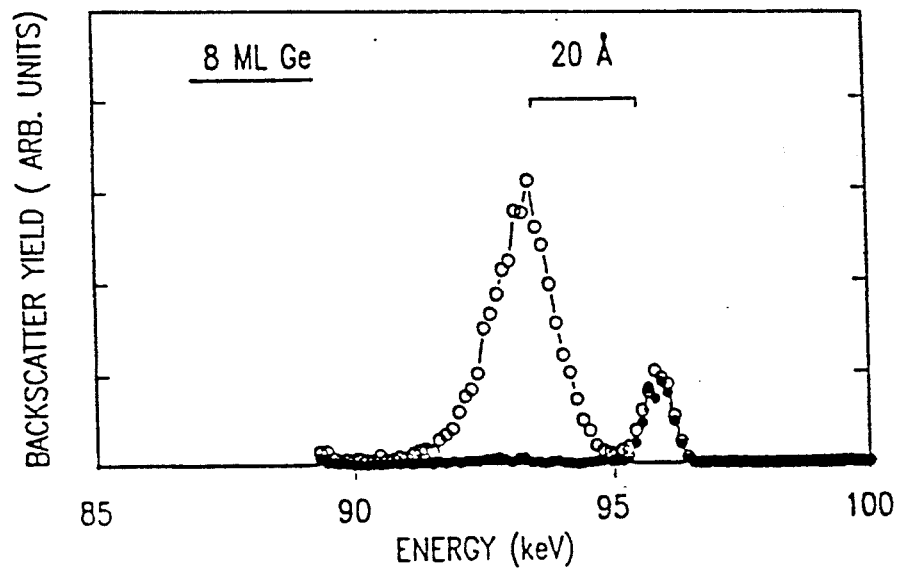
Figure 3A:
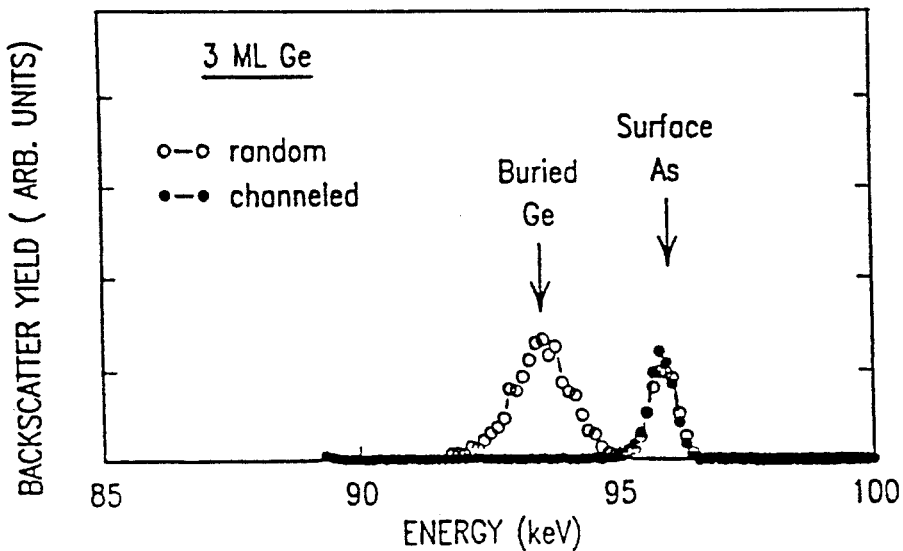

Evidence that germanium films thicker than six monolayers have been successfully embedded in silicon by using an arsenic surfactant is shown in the Rutherford ion backscattering spectra of FIGS. 3a–3c. Spectra are shown for both channelled and randomly incident beams of helium ions at an energy of about 100 keV. In FIG. 3a approximately three monolayers of germanium have been deposited at about 520° C. on an arsenic-saturated surface of silicon with a (001) crystallographic orientation. During the germanium deposition, an arsenic flux was maintained on the sample. Afterwards, the germanium film was capped with approximately sixteen monolayers of silicon. FIG. 3b and 3c respectively show approximately eight and approximately fifteen monolayers of germanium films grown under identical conditions. Unlike the films of the prior art shown in FIG. 1 and discussed in the Background Art section above, the thickness of the germanium layer has not saturated at approximately three monolayers, but a continuous film has been grown as thick as about fifteen monolayers. The low germanium backscatter yield in the channelling spectra of FIG. 3 is evidence of a high degree of epitaxy. Also, the germanium layer is essentially confined to the subsurface region. In samples fabricated using conventional molecular beam epitaxy, in contrast, germanium will typically diffuse as much as 60 Å through a silicon cap.

Figure 4:
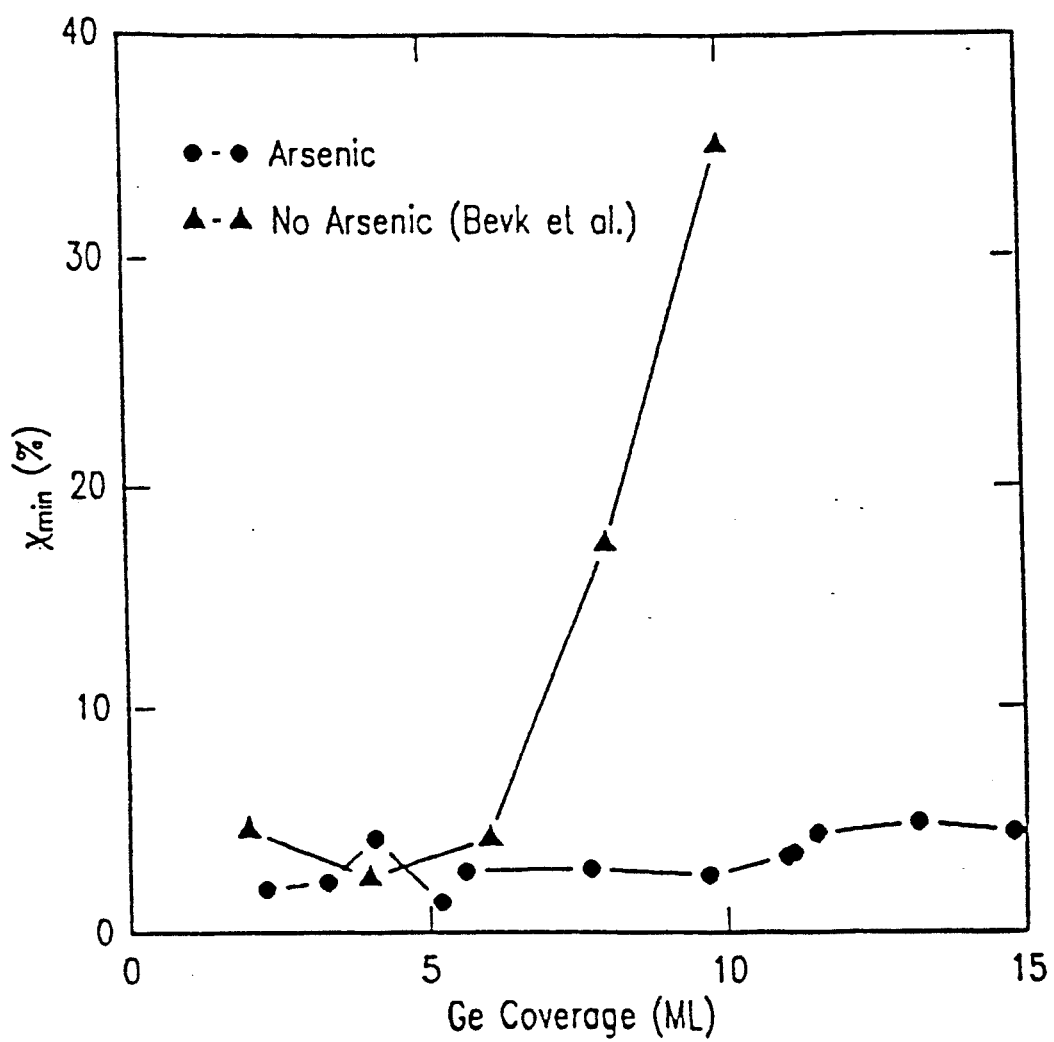
FIG. 4 is a plot of the minimum yield ($\chi_{min}$) for germanium backscattering from Si/Ge/Si(001) epitaxial-germanium-embedded-in-silicon structures grown with and without an arsenic surfactant. The minimum yield $\chi_{min}$ of bulk silicon in the absence of germanium is about 3 percent at the corresponding depth. Films grown without arsenic show an abrupt increase in $\chi_{min}$ at thicknesses exceeding about six monolayers. Films grown using an arsenic surfactant according to the invention show only a very gradual increase in $\chi_{min}$. Data for growth without arsenic was taken from J. Bevk et al. *Applied Physics Letters*, volume 49, page 286 (1986).

The quality of the germanium epitaxy can be evaluated by the backscattering yield under channelling conditions relative to the yield in a random incidence geometry. This ratio, known as the minimum yield ($\chi_{min}$), is typically about 3 percent for a bulk crystal. Any imperfections in a crystal would result in greater dechannelling, thereby raising $\chi_{min}$. The minimum yield for the epitaxial germanium films has been plotted as a function of coverage in FIG. 4. For films grown with an arsenic surfactant, there is only a small increase in $\chi_{min}$ with germanium coverage to no greater than about five percent. But films grown without a surfactant show a significantly different behavior. Data taken from an article published J. Bevk et al. *Applied Physics Letter* volume 49, page 286 (1986) demonstrate a substantial increase in dechannelling at thicknesses greater than about six monolayers. The increase in dechannelling is due to a breakdown in the epitaxy of the film. Thus, a unique property of the structure described in this disclosure is that at thicknesses exceeding about six monolayers, there is no significant increase in $\chi_{min}$.

Additional analysis of preferred layered structures of the invention is set forth in an article by the present inventors and two coworkers published in *Physical Review Letters* volume 63, pages 632 through 635 (Aug. 7, 1989), which article is hereby incorporated in the present specification by reference.

It is not intended to limit the present invention to the specific embodiments described above. It is recognized that changes may be made in the processes and structures specifically described herein without departing from the scope and teaching of the present invention, and it is intended to dencompass all other embodiments, alternatives, and modifications consistent with the invention.

We claim:

1. A process for depositing a layer of a first crystallizable material on a target surface of a substantially-single-crystalline-portion of a second material to produce a multi-atomic-layer, essentially-epitaxial layer of the first material on the second material, the method comprising the steps of:
   (a) exposing the target surface of the second material to a vacuum;
   (b) directing a gaseous flux comprising a multivalent surfactant element onto the target surface to deposit the surfactant element on the target surface with a coverage of at least approximately one monolayer;
   (c) directing a gaseous flux comprising the first material onto the target surface bearing the multivalent surfactant element, the multivalent surfactant element facilitating a layer-by-layer epitaxial growth of the first material on the target surface of the second material.

2. The process according to claim 1 in which the multi-valent surfactant element is selected from the group consisting of boron, aluminium, gallium, indium, thallium, phosphorous, arsenic, antimony, bismuth, gold, silver and lead.

3. The process according to claim 2 in which the multi-valent surfactant element is arsenic.

4. The process according to claim 2 in which the multi-valent surfactant element is antimony.

5. The process according to claim 1 in which the first crystallizable material is germanium or silicon.

6. The process according to claim 1 in which the second material is selected from the group consisting of silicon, germanium, and gallium arsenide.

7. The process according to claim 1 in which the second material is a silicon-germanium alloy.

8. The process according to claim 1 in which the second material is silicon and the process further comprises the step of:
   (d) maintaining the target surface of the silicon second material at a temperature in the range of from about 450° C. to about 650° C. when the gaseous flux comprising the first material is directed onto the target surface bearing the multivalent surfactant element.

9. The process according to claim 8 in which the target surface the silicon second material is a crystal face having an (001) crystallographic orientation and the target surface is maintained at a temperature in the range of from about 450° C. to about 550° C. when the gaseous flux comprising the first material is directed onto the target surface bearing the surfactant element.

10. The process according to claim 8 in which the target surface the silicon second material is a crystal face having an (111) crystallographic orientation and the target surface is maintained at a temperature in the range of from about 450° C. to about 550° C. when the gaseous flux comprising the first material is directed onto the target surface bearing the surfactant element.

11. The process according to claim 11 in which the first material is germanium and the gaseous flux comprising the germanium first material includes elemental germanium vapor or $GeH_4$.

12. The process according to claim 11, further comprising the step of:
   (d) directing a gaseous flux comprising the multivalent surfactant element onto the target surface bearing the surfactant element during a time when the gaseous flux comprising the first material is directed on the surface to maintain a coverage of the surfactant element on the surface as the layer of first material is deposited.

* * * * *